United States Patent [19]
Honda et al.

[11] Patent Number: 5,817,610
[45] Date of Patent: Oct. 6, 1998

[54] NON-CORROSIVE CLEANING COMPOSITION FOR REMOVING PLASMA ETCHING RESIDUES

[75] Inventors: Kenji Honda, Barrington, R.I.; Taishih Maw, Fremont, Calif.

[73] Assignee: Olin Microelectronic Chemicals, Inc., Norwalk, Conn.

[21] Appl. No.: 709,054

[22] Filed: Sep. 6, 1996

[51] Int. Cl.$^6$ .................. C11D 7/26; C11D 7/32; C11D 7/60

[52] U.S. Cl. .................. 510/176; 510/175; 510/255; 510/259; 510/504

[58] Field of Search ................... 510/175, 176, 510/255, 259, 504; 134/2, 38, 41, 42

[56] References Cited

U.S. PATENT DOCUMENTS

| | | | |
|---|---|---|---|
| 3,582,401 | 6/1971 | Berilla et al. | 134/3 |
| 3,961,992 | 6/1976 | Jahnke et al. | 148/6.15 R |
| 3,962,108 | 6/1976 | Perruccio | 252/142 |
| 4,015,986 | 4/1977 | Paal et al. | 96/36 |
| 4,020,040 | 4/1977 | Kattoh et al. | 260/42.56 |
| 4,051,047 | 9/1977 | Liston | 252/33 |
| 4,169,068 | 9/1979 | Harita et al. | 252/143 |
| 4,239,661 | 12/1980 | Muraoka et al. | 252/541 |
| 4,304,681 | 12/1981 | Martin et al. | 252/143 |
| 4,395,348 | 7/1983 | Lee | 252/143 |
| 4,395,479 | 7/1983 | Ward et al. | 430/258 |
| 4,401,747 | 8/1983 | Ward, Jr. et al. | 430/258 |
| 4,401,748 | 8/1983 | Ward, Jr. et al. | 430/258 |
| 4,403,029 | 9/1983 | Ward, Jr. et al. | 430/258 |
| 4,423,159 | 12/1983 | Ebra et al. | 521/35 |
| 4,428,871 | 1/1984 | Ward et al. | 252/542 |
| 4,617,251 | 10/1986 | Sizensky | 430/256 |
| 4,680,133 | 7/1987 | Ward | 252/153 |
| 4,770,713 | 9/1988 | Ward | 134/38 |
| 4,786,578 | 11/1988 | Neisius et al. | 430/256 |
| 4,791,043 | 12/1988 | Thomas et al. | 430/256 |
| 4,824,762 | 4/1989 | Kobayashi et al. | 430/258 |
| 4,824,763 | 4/1989 | Lee | 430/258 |
| 4,830,772 | 5/1989 | Van De Mark | 252/170 |
| 4,844,832 | 7/1989 | Kobayashi et al. | 252/143 |
| 4,904,571 | 2/1990 | Miyashita et al. | 430/331 |
| 4,940,759 | 7/1990 | Yang | 526/62 |
| 4,944,893 | 7/1990 | Tanaka et al. | 252/171 |
| 4,971,715 | 11/1990 | Armant et al. | 252/143 |
| 4,992,108 | 2/1991 | Ward et al. | 134/38 |
| 4,994,153 | 2/1991 | Piano et al. | 204/15 |
| 5,091,103 | 2/1992 | Dean et al. | 252/162 |
| 5,102,777 | 4/1992 | Lin et al. | 430/331 |
| 5,104,515 | 4/1992 | Chu et al. | 208/46 |
| 5,114,834 | 5/1992 | Nachshon | 430/329 |
| 5,128,230 | 7/1992 | Templeton et al. | 430/191 |
| 5,139,607 | 8/1992 | Ward et al. | 156/655 |
| 5,145,717 | 9/1992 | Drury | 427/96 |
| 5,156,828 | 10/1992 | Degnan et al. | 423/709 |
| 5,174,816 | 12/1992 | Aoyama et al. | 106/203 |
| 5,185,235 | 2/1993 | Sato et al. | 430/331 |
| 5,219,700 | 6/1993 | Nakai et al. | 430/191 |
| 5,234,795 | 8/1993 | Jeffries, III et al. | 430/326 |
| 5,266,440 | 11/1993 | Zampini | 430/192 |
| 5,279,771 | 1/1994 | Lee | 252/548 |
| 5,308,745 | 5/1994 | Schwartzkopf | 430/329 |
| 5,334,332 | 8/1994 | Lee | 252/548 |
| 5,348,687 | 9/1994 | Beck et al. | 252/582 |
| 5,381,807 | 1/1995 | Lee | |
| 5,409,800 | 4/1995 | Sato et al. | 430/263 |
| 5,417,802 | 5/1995 | Osbeng | 216/13 |
| 5,419,779 | 5/1995 | Ward | 134/38 |
| 5,419,995 | 5/1995 | Zampini | 430/192 |
| 5,446,126 | 8/1995 | Honda | 528/482 |
| 5,472,830 | 12/1995 | Honda | 430/331 |
| 5,480,585 | 1/1996 | Shiotsu et al. | 252/544 |
| 5,482,566 | 1/1996 | Lee | 134/42 |
| 5,496,491 | 3/1996 | Ward et al. | 252/153 |
| 5,507,978 | 4/1996 | Honda | 252/544 |
| 5,561,105 | 10/1996 | Honda | 510/178 |
| 5,571,642 | 11/1996 | Wakata et al. | 430/7 |
| 5,571,886 | 11/1996 | Zampini | 528/143 |
| 5,580,846 | 12/1996 | Hayashida et al. | 510/175 |
| 5,612,304 | 3/1997 | Honda et al. | 510/176 |
| 5,648,324 | 7/1997 | Honda et al. | 510/176 |
| 5,693,599 | 12/1997 | Aoyama et al. | 510/175 |

FOREIGN PATENT DOCUMENTS

| | | |
|---|---|---|
| 0 647 884 A1 | 10/1993 | European Pat. Off. |
| 143920 | 9/1980 | Germany |
| 143921 | 9/1980 | Germany |
| 3821231 | 1/1989 | Germany |
| 3828513 | 3/1990 | Germany |
| 56-115368 | 9/1981 | Japan |
| 63-050838 | 9/1981 | Japan |
| 62-132723 | 6/1987 | Japan |
| 63-208043 | 8/1988 | Japan |
| 1-042653 | 2/1989 | Japan |
| 1-081949 | 3/1989 | Japan |
| 1-081950 | 3/1989 | Japan |
| 89-013217 | 3/1989 | Japan |
| 1-088548 | 4/1989 | Japan |

(List continued on next page.)

OTHER PUBLICATIONS

"Development Of Advanced Corrosion Free Organic Strippers For ULSI Processing" by A.L.P. Rotondaro, K. Honda, T. Maw, D. Perry, M. Lux, M.M. Heyns. C. Claeys and I. Daraktchiev, appearing at Fourth International Symposium On Cleaning Technology In Semiconductor Device Manufacturing, Oct. 1995, Chicago, Illinois.

"Investigation Of Advanced Organic Strippers For ULSI Processing" A.L.P. Rotondaro, R.M. Gluck, M. Meuris, M.M. Heyns C. Claeys, K. Honda and I. Daraktchiev for presentation at Interface 94, Nov. 1994, San Diego, CA.

"Thin Film Pitting: Is NMP the Culprit?", by Dr. Franco T. Lee, Dr. David R. Wanlass and B. Walsh, appearing in Semiconductor International, Jun. 1994.

*Primary Examiner*—Douglas J. McGinty
*Attorney, Agent, or Firm*—Ohlandt, Greely Ruggiero & Perle

[57] ABSTRACT

A non-corrosive cleaning composition for removing plasma etching residues comprising water, at least one quaternary ammonium hydroxide, and at least one corrosion inhibitor selected from (i) quaternary ammonium silicates and (ii) catechol nucleus-containing oligomers having a molecular weight in the range of about 220 to about 5,000.

8 Claims, No Drawings

FOREIGN PATENT DOCUMENTS

| | | |
|---|---|---|
| 1-114846 | 5/1989 | Japan . |
| 1-133049 | 5/1989 | Japan . |
| 2-048668 | 2/1990 | Japan . |
| 2-131239 | 5/1990 | Japan . |
| 2-253265 | 10/1990 | Japan . |
| 4-124668 | 4/1992 | Japan . |
| 5-045894 | 2/1993 | Japan . |
| 93-024498 | 4/1993 | Japan . |
| 4-350660 | 11/1993 | Japan . |
| 7-028254 | 1/1995 | Japan . |
| 7-244386 | 9/1995 | Japan . |
| 7-271056 | 10/1995 | Japan . |
| WO 8805813 | 3/1988 | WIPO . |
| 95/23999 | 9/1995 | WIPO . |

NON-CORROSIVE CLEANING COMPOSITION FOR REMOVING PLASMA ETCHING RESIDUES

BACKGROUND OF THE INVENTION

1. Field of The Invention

This invention relates to a cleaning composition for use in microelectronics manufacturing, and more particularly to a non-corrosive cleaning composition that removes plasma etching by-products formed on wafer substrates after plasma etching of metal or metal oxide layers deposited on substrates.

2. Brief Description of Art

In the manufacture of microcircuits, positive photoresists are used as an intermediate mask to transfer an original mask pattern of a reticle onto wafer substrates by means of a series of photolithography and plasma etching steps. One of the final steps in the microcircuit manufacturing is removal of the patterned photoresist films from the substrates. In general, this step is affected by two methods. One method involves a wet stripping process in which the photoresist-covered substrates are brought into contact with a photoresist stripper solution that consists primarily of an organic solvent and an amine. However, wet photoresist stripper solutions cannot remove photoresist films effectively and completely in all cases, especially if they are exposed to UV irradiation and plasma treatments during the fabrication processes. Some photoresist films are highly crosslinked by such high energy treatments and become more difficult to dissolve in the stripper solution. In addition, the chemicals used in some conventional wet stripping solutions are ineffective in removing inorganic residues formed by the earlier step of plasma etching of metal or metal oxide layers with halogen containing gases.

An alternative method of removing a photoresist film involves exposing a photoresist-coated wafer to an oxygen plasma to burn the resist film from substrate in a process known as oxygen plasma ashing. Recently, oxygen plasma ashing has become more popular in the microcircuit manufacturing process because it is carried out in a vacuum chamber and, hence, is expected to be less susceptible to airborne particulate or metallic contamination. However, oxygen plasma ashing is also not fully effective in removing the plasma etching residues noted above. Instead, removal of these plasma etching residues is accomplished by exposing them to certain alkaline solutions. Several commercial products are now available to clean the plasma etching residues left by plasma etching followed by oxygen ashing. For example, EKC 265, obtained from EKC Technology, Inc., is a cleaning solution composed of water, alkanolamine, catechol and hydroxylamine. Such a composition is disclosed in U.S. Pat. No. 5,279,771 by Wai M. Lee. ACT 935, obtained from Ashland Chemical, is another cleaning solution composed of water, alkanolamine and catechol. In both cases, catechol is used as a corrosion inhibitor. A post-strip rinse, R-10, obtained from Mitsubishi Gas Chemical, is also composed of water, alkanolamine and a sugar alcohol, wherein the sugar alcohol acts as a corrosion inhibitor.

In these commercial products, a combination of water and alkanolamine will not only dissolve the plasma etching residues, and will also attack metallic layers patternwise deposited on the substrate. The addition of a corrosion inhibitor is thus necessary in those products to prevent the unwanted attack on the metallic layers in the substrate. However, since these products have high pHs (above 11), they may attack certain corrosion-sensitive metal layers in the wafer substrate regardless of the presence of a corrosion inhibitor. Particularly, metal layers such as aluminum or its alloys (e.g., Al—Cu—Si), titanium nitride, titanium tungsten and the like are especially corrosion-sensitive. Therefore, the addition of a suitable corrosion inhibitor in a suitable amount is essential to prevent corrosion of the substrate metal layers without inhibiting the plasma etching residue removal. It is, however, difficult to balance the two desired results: (1) effective plasma etching residue removal and (2) effective corrosion inhibition. This dilemma is mainly due to the fact that the chemical compositions of the plasma etching residues are in general similar to those of the metal layers in the substrate. The alkanolamines included in the prior art cleaning compositions may thus randomly attack both the plasma etching residues and the substrate metal layers. Moreover, if a post-cleaner rinse such as isopropyl alcohol is not used, the corrosion may be very severe. In addition, it should be noted that some types of corrosion inhibitors tend to retard plasm etching residue removal. Accordingly, to date there has not been developed a perfect cleaning composition for removing plasma etching residues without metal layer corrosion. There has always been a tradeoff between plasma etching residue removal and substrate metal layer corrosion inhibition.

Several other patents in the photoresist stripper/cleaner application field exist as follows, although none of them disclose the use of the composition of the present invention.

Japanese Patent Application No. 7-028254 assigned to Kanto Kagaku discloses a non-corrosive photoresist removal liquid comprising a sugar alcohol, an alcohol amine, water, and a quaternary ammonium hydroxide.

PCT Published Pat. Application No. WO 88-05813 teaches a positive or negative photoresist stripper containing butyrolactone or caprolactone, quaternary ammonium hydroxide compound, and optionally a nonionic surfactant.

U.S. Pat. No. 4,239,661 to Muraoka et al. discloses a surface treating agent comprising an aqueous solution of 0.01 to 20% trialkyl(hydroxy-alkyl)ammonium hydroxide. This agent is useful in removing organic and inorganic contaminants deposited on the surfaces of semiconductor products.

U.S. Pat. No. 4,904,571 to Miyashita et al. teaches printed circuit board photoresist stripper composition containing a solvent (e.g., water, alcohols, ethers, ketones, etc.), an alkaline compound dissolved in the solvent, including quaternary ammonium hydroxide, and a borohydride compound dissolved in the solvent.

U.S. Pat. No. 5,091,103 to Dean et al. teaches a positive photoresist stripping composition containing the combination of: (A) N-alkyl-2-pyrrolidone; (B) 1,2-propanediol; and (C) tetraalkylammonium hydroxide.

U.S. Pat. No. 5,139,607 to Ward et al. teaches positive and negative photoresist stripping composition containing tetrahydrofurfuryl alcohol, a polyhydric alcohol (e.g., ethylene glycol or propylene glycol), the reaction product of furfuryl alcohol and an alkylene oxide, a water-soluble (Bronstead) base type hydroxide compound (e.g., alkali metal hydroxide, ammonium hydroxide and tetramethyl ammonium hydroxide), and water. Optionally, the composition may also contain up to 1% of a nonionic surfactant.

U.S. Pat. No. 5,174,816 to Aoyama et al. discloses a composition for removing chlorine remaining on the surface of an aluminum line pattern substrate after dry etching, comprising an aqueous solution containing 0.01 to 15% by weight of a quaternary ammonium hydroxide, such as trimethyl(2-hydroxyethyl)ammonium hydroxide, and 0.1 to 20% by weight of sugar or sugar alcohol, such as xylitol, mannose, glucose, and the like.

In the above-mentioned examples of art of the photoresist stripping and cleaning technology, a mixture of water and organic amines, especially alkanolamines, are used as essential ingredients of the cleaning compositions. These essential ingredients dissolve metal or metal oxide type of plasma etching residues due to the reaction of the residues with hydroxide ion that is formed by the reaction of amines with water. To inhibit the corrosion of substrate metals patternwise deposited on wafers, corrosion inhibitors such as catechol, sugar alcohols, and other reducing or chelating compounds have been added to the mixtures of water and amines. However, none of the prior art teaches the use of a mixture of water and quaternary ammonium hydroxides in combination with selected corrosion inhibitors that can effectively prevent the corrosion of substrate metal layers without retarding the plasma etching residue removal.

BRIEF SUMMARY OF THE INVENTION

The present invention is directed to a non-corrosive cleaning composition for removing plasma etching residues comprising:

(A) water;

(B) at least one quaternary ammonium hydroxide; and (C) at least one corrosion inhibitor selected from the group consisting of (i) quaternary ammonium silicates such as tetramethylammonium silicate; and (ii) catechol nucleus-containing oligomers which have a molecular weight in the range of about 220 to about 5,000.

The cleaning composition of the invention is effective in removing plasma etching residues formed on wafers without corroding metallic layers.

DETAILED DESCRIPTION OF THE PREFERRED EMBODIMENTS OF THE PRESENT INVENTION

The present invention is directed to a non-corrosive cleaning composition for removing plasma etching residues from wafer substrates comprising water, a quaternary ammonium hydroxide, and at least one selected corrosion inhibitor.

The quaternary ammonium hydroxide component included in the composition of the invention includes any tetraalkylammonium hydroxides having alkyl groups of methyl, ethyl, propyl, butyl, hydroxyethyl, benzyl, and the combinations thereof (e.g., such as tetramethylammonium hydroxide, tetraethylammonium hydroxide, trimethyl hydroxyethylammonium hydroxide, methyl tri(hydroxyethyl)ammonium hydroxide, benzyl trimethylammonium hydroxide, and the like). Additionally, combinations of ammonium hydroxide with the quaternary ammonium hydroxides may also be used. Preferably, the quaternary ammonium hydroxide component is present in the composition of the invention in the range of about 0.01% to about 10% by weight.

Corrosion inhibitors useful in the invention include quaternary ammonium silicates, and catechol nucleus-containing oligomers which have a molecular weight in the range of about 220 to about 5,000. In particular, the catechol oligomers are most preferred among all the candidates described above.

Silicates are known to inhibit metal corrosion in some application areas such as resist developers for aluminum substrates. However, this chemistry has not been applied to the stripper/cleaner field. In microelectronics manufacturing, any metallic contamination decreases the device life of microcircuits so that alkali metal silicates such as sodium silicate which have been used in other application areas cannot be used. Therefore, quaternary ammonium silicates such as tetramethylammonium silicate are useful in the composition of the invention.

Some of the catechol nucleus-containing oligomers useful in the invention are commercially available; for example, the following compounds are obtained from Honshu Chemical: 4,4'-[3,4-dihydroxyphenyl)methylene]bis[2-methylphenol], trade name of Tris P-234, 4-(1',3',4',9'a-tetrahydro-5',6'-dihydroxyspiro[cyclohexane-1,9'-[9H]xanthen]-4]'a(2'H)-yl)-1,2,3-benzenetriol, trade name of Pyrogallol Flavan Z, and 4,4'-[1,4-phenylenebis(1-methylethylene)]bis[1,2,3-benzenetriol], trade name of Bis PG-P.

In addition, more catechol nucleus-containing oligomers useful in the invention can be synthesized by addition-condensation reaction of catechol with formaldehyde or related aldehydes or ketones in the presence or absence of other phenolic compounds. The phenolic compounds added to catechol should preferably have hydrophilic groups to increase their solubility in the cleaning composition of the invention of resulting oligomers. The resulting oligomers have a molecular weight in the range of about 220 to about 5,000.

Preferably, the corrosion inhibitor is present in the composition of the invention in the range of about 0.01% to about 10% by weight, and more preferably in the range of about 0.5% to about 5% by weight to a total weight of the cleaning composition.

The cleaning composition of the present invention can be used either after an oxygen plasma ashing step or after a conventional wet photoresist stripping step. The cleaning composition of the invention is not designed to remove photoresist films from wafer substrates. Rather, the cleaning composition of the invention is formulated to remove plasma etching residues after removing photoresists by the dry or wet stripping method.

The following synthesis and examples are intended to illustrate the various aspects of the invention, but are not intended to limit the scope of the invention. All % and parts are by weight and all temps are degrees Celcius unless explicitly stated otherwise.

SYNTHESIS 1

N-methyl-2-pyrrolidone NMP, 110 grams, was placed in a 500 ml flask equipped with a mechanical stirrer, a condenser, and dropping funnel, and the flask was heated to 70°–75° C. with stirring. Catechol, 110 grams, was gradually added to NMP with stirring, followed by 65.5 grams of 36.7% aqueous formalin, added dropwise to the reaction solution over an hour. An aqueous solution of 7.0 wt % oxalic acid (18.0 grams) was slowly added to the above solution over 30 minutes. The reaction mixture was heated at a refluxing temperature of water with stirring for an additional eight hours, and then heated at about 120° C. in a vacuum to remove water and NMP from the reaction solution by distillation.

The resulting product was characterized by GPC (Gel Permeation Chromatography) to measure the molecular weight using a polystyrene standard reference. A weight-average molecular weight of the reaction product was 2,450 with a polydispersity of 2.3.

EXAMPLE 1

A cleaning solution was prepared by diluting OPD 262, 2.39 wt % TMAH (tetramethyl ammonium hydroxide) aqueous solution obtained from Olin Corporation, with deionized water by a factor of 10 and adding the product obtained in Synthesis 1 by 4.0 wt % to a total weight of the cleaning solution.

The cleaning of a metal etch residue from a substrate was made with the above cleaning composition using a multi-layered substrate of Photoresist/SiO$_2$/TiN/Al—Si—Cu that was patterned lithographically, etched in a plasma metal etcher, and followed by oxygen plasma ashing to remove the top layer of photoresist completely. The thus prepared wafer was immersed in the above-mentioned cleaning solution at room temperature (about 25° C.) for 5 minutes without agitation. The wafer was then immersed in isopropyl alcohol (IPA) for 60 seconds with agitation, followed by deionized water rinse at room temperature with nitrogen bubbling for 5 minutes.

The thus treated wafer was analyzed by a field emission type scanning electron microscope SEM to observe the surface. SEM showed that the plasma etching residues were completely removed with no metal attack to both the metal layers of Al—Si—Cu and TiN.

COMPARISON 1

A reference cleaning solution was prepared according to the steps outlined in Example 1 except that no corrosion inhibitor was added. The cleaning test was carried out on a multilayered substrate according to the same method as described in Example 1. SEM surface analysis showed severe metal corrosion and complete removal of the plasma etching residues.

While the invention has been described above with reference to specific embodiments thereof, it is apparent that many changes, modifications and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A cleaning composition for removing residues formed during plasma etching from a substrate, said cleaning composition comprising:
   (A) water;
   (B) at least one quaternary ammonium hydroxide; and
   (C) at least one corrosion inhibitor selected from the group consisting of 4,4'-((3,4-dihydroxyphenyl)methylene)bis(2-methylphenol); 4-(1',3',4',9'a-tetrahydro-5',6'-dihydroxyspiro(cyclohexane-1,9'-(9H)xanthen)-4'a(2'H)-yl-1,2,3-benzenetriol; and 4,4'-(1,4-phenylenebis(1-methylethylidene)bis(1,2,3-benzenetriol).

2. The cleaning composition of claim 1 wherein said quaternary ammonium hydroxide is a tetraalkyl ammonium hydroxide, wherein said alkyl groups are selected from methyl, ethyl, propyl, butyl and combinations thereof.

3. The cleaning composition of claim 1 wherein said quaternary ammonium hydroxide is selected from the group consisting of trimethyl hydroxyethyl ammonium hydroxide, methyl tri(hydroxyethyl)ammonium hydroxide, benzyltrimethyl ammonium hydroxide.

4. The cleaning composition of claim 1 where the quaternary ammonium hydroxide is present in said cleaning composition in an amount from about 0.01% to about 10% by weight, based on the total weight of the composition.

5. The cleaning composition of claim 1 wherein said corrosion inhibitor is 4,4'-[(3,4-dihydroxyphenyl)methylene]bis[2-methylphenol].

6. The cleaning composition of claim 1 wherein said corrosion inhibitor is 4-(1',3',4',9'a-tetrahydro-5',6'-dihydroxyspiro[cyclohexane-1,9'-[9H]xanthen]-4]'a(2'H)-yl)-1,2,3-benzenetriol.

7. The cleaning composition of claim 1 wherein said corrosion inhibitor is 4,4'-[1,4-phenylenebis(1-methylethylidene)]bis[1,2,3-benzenetriol].

8. The cleaning composition of claim 1 wherein the amount of corrosion inhibitor is from about 0.01% to about 10% by weight, based on the total weight of the cleaning composition.

* * * * *